(12) United States Patent
Gallagher et al.

(10) Patent No.: US 10,217,641 B2
(45) Date of Patent: Feb. 26, 2019

(54) CONTROL OF CURRENT COLLAPSE IN THIN PATTERNED GAN

(71) Applicants: International Business Machines Corporation, Armonk, NY (US); Massachusetts Institute of Technology, Cambridge, MA (US)

(72) Inventors: William J. Gallagher, Ardsley, NY (US); Marinus Johannes Petrus Hopstaken, Carmel, NY (US); Ko-Tao Lee, White Plains, NY (US); Tomas Palacios, Belmont, MA (US); Daniel Piedra, Cambridge, MA (US); Devendra K. Sadana, Pleasantville, NY (US)

(73) Assignees: International Business Machines Corporation, Armonk, NY (US); MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 100 days.

(21) Appl. No.: 15/001,957

(22) Filed: Jan. 20, 2016

(65) Prior Publication Data

US 2016/0225887 A1 Aug. 4, 2016

Related U.S. Application Data

(60) Provisional application No. 62/105,498, filed on Jan. 20, 2015.

(51) Int. Cl.
*H01L 29/778* (2006.01)
*H01L 21/306* (2006.01)
*H01L 21/02* (2006.01)
*H01L 29/207* (2006.01)
*H01L 29/10* (2006.01)
*H01L 29/20* (2006.01)

(52) U.S. Cl.
CPC .... *H01L 21/30612* (2013.01); *H01L 21/0254* (2013.01); *H01L 21/0262* (2013.01); *H01L 21/02458* (2013.01); *H01L 21/02579* (2013.01); *H01L 29/1075* (2013.01); *H01L 29/2003* (2013.01); *H01L 29/207* (2013.01); *H01L 29/778* (2013.01)

(58) Field of Classification Search
CPC .................................................... H01L 29/778
USPC ........................................................ 257/76
See application file for complete search history.

(56) References Cited

U.S. PATENT DOCUMENTS

2012/0205717 A1\* 8/2012 Kurahashi ......... H01L 29/42316
257/194
2014/0339679 A1\* 11/2014 Komiyama ......... H01L 29/2003
257/615
2015/0380242 A1\* 12/2015 Chang ............... H01L 21/02381
257/607

(Continued)

*Primary Examiner* — Hsin-Yi Hsieh
(74) *Attorney, Agent, or Firm* — Scully, Scott, Murphy & Presser, P.C.; L. Jeffrey Kelly, Esq.

(57) ABSTRACT

A GaN device is formed on a semiconductor substrate having a plurality of recessed regions formed in a surface thereof. A seed layer, optional buffer layer, and gallium nitride layer such as a carbon-doped gallium nitride layer are successively deposited within the recessed regions. Improved current collapse response of the GaN device is attributed to maximum length and width dimensions of the multilayer stack.

16 Claims, 8 Drawing Sheets

(56) References Cited

U.S. PATENT DOCUMENTS

2016/0181085 A1\* 6/2016 Dasgupta .......... H01L 21/02381
257/76

\* cited by examiner

CONTROL OF CURRENT COLLAPSE IN THIN PATTERNED GAN

GOVERNMENT RIGHTS

This invention was made with government support under contract no. N00014-13-C-0167, awarded by the Office of Naval Research. The government has certain rights in the invention.

BACKGROUND

The present application relates generally to semiconductor devices and methods of manufacture, and more specifically to gallium nitride-based devices.

Gallium nitride (GaN) possesses fundamental materials properties that make it an attractive candidate for semiconductor device fabrication. These properties include a large bandgap (~3.4 eV), which enables high temperature operation, a direct bandgap for fabricating light emitting diodes, the ability to form heterostructures with aluminum and indium, and high saturation velocity and breakdown field strength.

Though significant advances have been made in the development of GaN-based optoelectronic devices, including devices suitable for high power, high frequency and/or high temperature applications, a limitation to improving device efficiency is the presence of various deep traps within GaN, especially traps responsible for a current collapse phenomena in GaN metal-semiconductor field effect transistors. Current collapse occurs when the GaN on-resistance increases and current decreases during the application of high voltage to the device.

In view of the foregoing, it would be advantageous to develop structures and related methods of manufacture that minimize the impact of current collapse in GaN-based devices.

SUMMARY

In accordance with embodiments of the present application, a gallium nitride device is formed on a semiconductor substrate having a plurality of recessed regions formed in a surface thereof. A seed layer, optional buffer layer, and doped gallium nitride layer are successively deposited within the recessed regions. Improved current collapse response of the GaN device is attributed to maximum length and width dimensions of the aforementioned multilayer stack. In embodiments, the layered structure of the optional buffer layer and the doped gallium nitride layer has a thickness of at least 0.5 microns, a length of 1 to 200 microns, and a width of 1 to 200 microns. The device may comprise a gallium nitride high electron mobility transistor.

A method of forming such a gallium nitride device, which in embodiments exhibits improved current collapse, includes forming a recessed region in a surface of a semiconductor substrate, forming a seed layer within the recessed region directly over the semiconductor material, and forming a layered structure over the seed layer, the layered structure including a buffer layer and a doped gallium nitride layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Reference will now be made in greater detail to various embodiments of the subject matter of the present application, some embodiments of which are illustrated in the accompanying drawings. The same reference numerals will be used throughout the drawings to refer to the same or similar parts.

Heterojunction field effect transistors (FETs), also known as high electron mobility transistors (HEMTs), have as a channel a junction between two materials with different band gaps instead of a doped region as in the case of conventional metal oxide semiconductor field effect transistors (MOSFETs). Gallium nitride HEMTs have attracted attention due to their high-power performance. HEMT transistors are able to operate at higher frequencies than traditional transistors, up to millimeter wave frequencies, and can be used in high-frequency products such as cell phones, satellite television receivers, voltage converters, and RADAR equipment.

Compared to silicon devices, GaN devices exhibit lower power losses and higher energy efficiency. Widespread implementation of conventional GaN heterojunction FETs (HFETs) has been dampened, however, due to a current collapse phenomenon where current decreases and on-resistance increases during operation.

Current collapse is a phenomenon observed in GaN-based transistors where the device current measured at a non-zero drain-source voltage ($Y_{ds}$) and gate voltage ($V_g$) under certain pulsed conditions is less than the current measured at the same drain and gate voltage under DC conditions, or pulsed conditions where no stress is applied, i.e., $V_{ds}=0V$ and $V_g$=0V. When reference is made herein to current collapse or a relative current collapse, the DARPA milestone metric was used (quiescent operating point of $V_{ds}$=10V and $V_g$=−3V with a pulse width of 500 ns).

Pronounced current collapse (40% or greater) has been observed in comparative carbon-doped GaN HEMTs when a blanket GaN layer thickness is less than 2 microns (e.g., less than 1.2 microns). As shown herein, current collapse can be reduced to less than 10% for patterned GaN HEMT structures having a gallium nitride thickness of 2 microns or less, e.g., 0.5, 0.6, 0.7, 0.8, 0.9, 1, 1.2, 1.5 or 2 microns, including ranges between any of the foregoing values.

In addition to current collapse under an applied bias, a large mismatch in the coefficient of thermal expansion (CTE) between gallium nitride and many substrate materials including silicon, silicon carbide, and sapphire may lead to crack formation in the deposited gallium nitride layer and/or unacceptable bow or warp of the substrate when the deposited structure is cooled, for example, during processing.

As used herein, 'bow' and 'warp' are complimentary measures of the flatness of a wafer or semiconductor substrate. For a wafer having a median surface defined as the locus of points in the wafer equidistant between the front and back surfaces, wafer bow is equal to the deviation of the center point of the median surface of a free, unclamped wafer from the median surface reference plane established by three points equally spaced on a circle with a diameter a specified amount less than the nominal diameter of the wafer (ASTM F534).

When measuring and calculating bow, the location median surface of the wafer must be known. By measuring deviations of the median surface, localized thickness variations at the center point of the wafer are removed from the calculation.

Because bow is measured at the center point of the wafer only, a three (3) point reference plane about the edge of the wafer is calculated. The value of bow is then calculated by measuring the location of the median surface at the center of the wafer and determining its distance from the reference plane. Bow can be positive or negative. A positive value indicates that the center point of the median surface is above the three point reference plane, while a negative value indicates that the center point of the median surface is below the three point reference plane.

Like bow, warp is a measurement of the differentiation between the median surface of a wafer and a reference plane. Warp, however, uses the entire median surface of the wafer instead of only the position at the center point. By looking at the entire wafer, warp provides a measurement of true wafer shape. Warp is defined as the differences between the maximum and minimum distances of the median surface of a free, unclamped wafer from a reference place (ASTM F1390).

The location of the median surface is calculated as it is for bow. For warp determination, there are typically two choices for construction of the reference plane. One is the same three point plane around the edge of the wafer. The other is by performing a least squares fit calculation of median surface data acquired during the measurement scan. Warp is then calculated by finding the maximum deviation from the reference plane ($RPD_{max}$) and the minimum differentiation from the reference plane ($RPD_{min}$). $RPD_{max}$ is defined as the largest distance above the reference plane and is a positive number. $RPD_{min}$ is the largest distance below the reference plane and is a negative number. Warp is equal to $RPD_{max}$-$RPD_{min}$. In embodiments, the deposited gallium nitride layer(s) induce a bow in the substrate of less than 500 microns, e.g., less than 500, 200 or 100 microns.

Cracking can be particularly problematic for gallium nitride layer thicknesses greater than 0.5 micron. Also, gallium nitride also has a different lattice constant than many substrate materials, which may lead to the formation of defects in gallium nitride layers that ultimately impair device performance.

Disclosed are structures and related methods of manufacture that facilitate the integration of gallium nitride with substrate materials such as silicon, improve the mechanical robustness of the integrated architectures, and minimize the phenomenon of current collapse in GaN-based devices, including HEMTs.

Unless the context clearly dictates otherwise, the term "gallium nitride" refers to gallium nitride (GaN) and any of its alloys, such as aluminum gallium nitride ($Al_xGa_{1-x}N$), indium gallium nitride ($In_yGa_{1-y}N$), aluminum indium gallium nitride ($Al_xIn_yGa_{1-x-y}N$), etc. Further, gallium nitride may be doped, for example, with up to 6 percent by weight of carbon, magnesium, silicon, germanium, arsenic and/or phosphorus.

Figure 1:
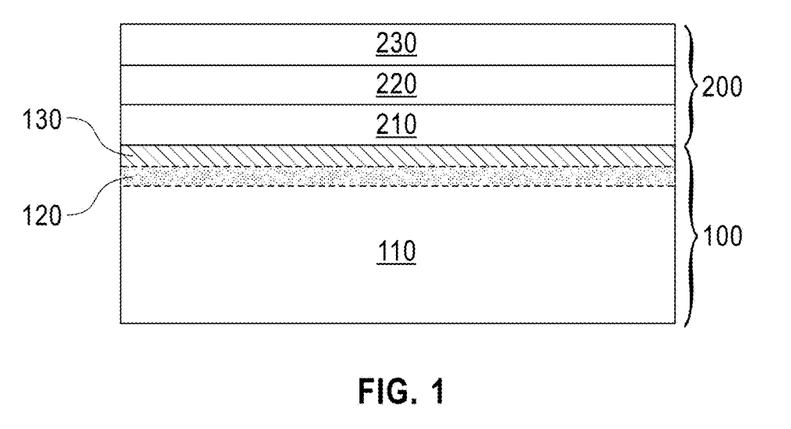
FIG. 1 is a simplified cross-sectional schematic of a high electron mobility transistor (HEMT) structure.

A schematic cross-section of a portion of a GaN-HEMT stack architecture is shown in FIG. 1. Hetero-epitaxial layers, which include from bottom to top, a seed layer 210 such as an AlN layer, a gallium nitride buffer layer 220 such as an AlGaN layer, and a doped gallium nitride layer 230 such as a carbon-doped GaN layer, can be grown by metal organic chemical vapor deposition (MOCVD) on a semiconductor substrate 100. Layers 210, 220 and 230 are collective referred to as GaN-HEMT stack 200.

Substrate 100 may be a semiconductor material such as silicon or a silicon-containing material, including a bulk substrate. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. Example silicon substrates include silicon-on-insulator (SOI) substrates, silicon-on-sapphire (SOS) substrates, separation by implanted oxygen (SIMOX) substrates, and the like. As used herein, the term "single crystal" denotes a crystalline solid, in which the crystal lattice of the entire sample is substantially continuous and substantially unbroken to the edges of the sample with substantially no grain boundaries. In embodiments, substrate 100 can comprise (100) oriented silicon or (111) oriented silicon, for example.

Substrate 100 is not limited to silicon-containing materials, as the substrate 100 may comprise other semiconductor materials, including Ge and compound semiconductors such as GaAs, InAs and other like semiconductors.

The transistor structure depicted in FIG. 1 is formed on a semiconductor-on-insulator (SOI) substrate 100. The SOI structure includes, from top to bottom, a top semiconductor layer 130, an intermediate buried oxide (BOX) layer 120, and a bottom supporting substrate 110.

The substrate 100 may have dimensions as typically used in the art. Example substrate diameters include, but are not limited to, 50, 100, 150, 200, 300 and 450 mm. The total substrate thickness may range from 250 microns to 1500 microns, though in particular embodiments the substrate thickness is in the range of 725 to 775 microns, which corresponds to thickness dimensions commonly used in silicon CMOS processing.

The thickness of the top semiconductor layer 130 may range from 40 to 150 nm, e.g., 40, 100 or 150 nm, including ranges between any of the foregoing values. The top semiconductor layer 130 may comprise single crystal silicon (Si) such as (100)-oriented silicon. The thickness of the buried oxide layer 120 may range from 30 to 300 nm, e.g., 30, 50, 100, 150, 200, 250 or 300 nm, including ranges between any of the foregoing values. The buried oxide layer 120 may comprise, for example, silicon oxide (SiO$_2$). The supporting substrate 110 may comprise (100)-oriented silicon or (111)-oriented silicon, for example.

According to exemplary methods, gallium nitride layers 220, 230 may be grown as epitaxial layers using a metalorganic chemical vapor deposition (MOCVD) process. It will be appreciated, however, that other techniques known in the art may be used to deposit the gallium nitride layers including molecular beam epitaxy (MBE), hydride vapor phase epitaxy (HYPE), and the like.

The MOCVD process involves introducing different source gases into an environment (e.g., a process chamber) proximate to a substrate and providing conditions that support a reaction between the gases to form a layer on the substrate surface. The reaction proceeds until a layer of desired thickness is achieved. Characteristics of the deposited layer may be controlled by various parameters including gas composition and concentration, and the reaction conditions such as substrate temperature and chamber pressure. In embodiments, the surface of the substrate onto which a gallium nitride layer is deposited comprises a semiconductor material.

Examples of suitable source gases for the MOCVD growth of gallium nitride include trimethylgallium (TMG) or triethylgallium (TEG) as sources of gallium; ammonia (NH$_3$) as a source of nitrogen; CBr$_4$ or CCl$_4$ as sources of carbon; trimethylaluminum (TMA) or triethylaluminum (TEA) as sources of aluminum; and trimethylindium (TMI) or triethylindium (TEI) as sources of indium. The particular combination of source gases used depends, for example, upon the desired composition of the deposited layer. For example, an aluminum source (e.g., TMA or TEA), a gallium source (TMG or TEG), together with a nitrogen source may be used to deposit films having an Al$_x$Ga$_{1-x}$N composition.

The flow rates and relative ratios of the source gases may be controlled to provide gallium nitride layers having the desired composition. For the growth of Al$_x$Ga$_{1-x}$N layers, typical TMA flow rates are between 20 sccm and 100 sccm; typical TMG flow rates are between 20 sccm and 100 sccm; and the flow rate of ammonia is typically between 2 slm and 10 slm. The substrate temperature may range from 900° C. to 1200° C. and the chamber pressure may range from 1 torr to 760 torr, e.g., 10 torr to 100 torr. In embodiments, the process parameters are maintained constant so as to provide respective layers having a constant composition.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation.

The epitaxial layers and/or the substrate may be doped. Doping changes the electron and hole carrier concentrations of an intrinsic semiconductor at thermal equilibrium. A doped layer or region may be p-type or n-type.

As used herein, "p-type" refers to the addition of impurities to an intrinsic semiconductor that creates a deficiency of valence electrons. For gallium nitride, an example p-type dopant, i.e., impurity, is magnesium. As used herein, "n-type" refers to the addition of impurities that contribute free electrons to an intrinsic semiconductor. For gallium nitride, example n-type dopants, i.e., impurities, include but are not limited to, carbon, silicon and germanium. The dopant(s) may be introduced by ion implantation or may be introduced, for example, in situ, i.e., during a process sequence used to form the layer.

By way of example, carbon may be implanted into a gallium nitride layer such as gallium nitride layer 230 to form an n-type layer. Alternatively, a carbon source may be incorporated into the gas phase chemistry used to deposit the gallium nitride layer. The dopant concentration may range from $1 \times 10^{18}$ atoms/cm$^3$ to $5 \times 10^{21}$ atoms/cm$^3$, e.g., $5 \times 10^{19}$ atoms/cm$^3$ to $1 \times 10^{21}$ atoms/cm$^3$.

Figure 2A:
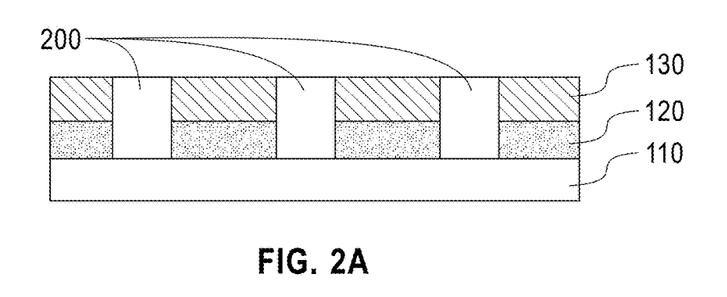
FIGS. 2A and 2B are cross-sectional schematics showing recessed GaN structures according to various embodiments.
Figure 2B:
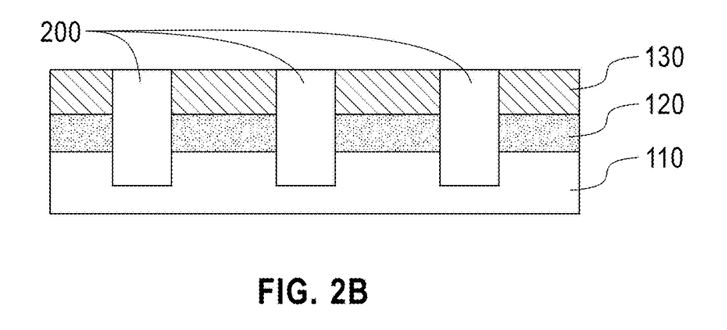

As shown in FIGS. 2A and 2B, according to various embodiments, device layers including AlN seed layer 210, AlGaN layer 220 and GaN layer 230 (collectively GaN-HEMT stack 200) are successively deposited within recessed regions formed in the substrate. To form recessed regions, a photoresist layer (not shown) can be applied over the substrate 100, and can be lithographically patterned to form openings in the photoresist layer that correspond to the areas of one or more recessed regions to be subsequently formed using, for example, an anisotropic etch. A recessed region can be formed for each opening in the photoresist layer. Recessed regions are formed by etching through each of the top semiconductor layer 130 and the intermediate buried oxide (BOX) layer 120, and optionally into the supporting substrate 110. In embodiments where recessed region-defining etch extends into the supporting substrate 110, at least a portion of the sidewalls of the recessed region will comprise a semiconductor material. The photoresist can be removed by ashing, or can be consumed during the etch process that forms one or more recessed regions. In further embodiments, prior to depositing the GaN-HEMT stack materials into the recessed region, a layer of dielectric material such as silicon nitride can be deposited onto the recessed region sidewalls. In an example process, a conformal dielectric layer can be deposited over exposed surfaces of the substrate, including within the recessed region, followed by an anisotropic etch of the dielectric layer that removes the dielectric layer from horizontal surfaces.

The recessed regions may have a prismatic shape, such as a square or rectangular prism having a length and width measured in directions parallel to a major surface of the substrate, and a depth measured in a direction normal to a major surface of the substrate 100.

The depth of each recessed region, as measured from the topmost surface of the substrate 100 to the bottom surface of the recessed region, can be from 0.9 to 2.5 microns, although lesser and greater depths are contemplated. The length and width dimensions of the recessed regions may independently range from 1 to 200 microns, e.g., 1, 2, 5, 10, 20, 50, 100, 150 or 200 microns.

Deposition of the device layers into the recessed regions can be selective such that seed layer 210, for example, is deposited only on an exposed surface of the supporting substrate 110 and not on the buried oxide layer 120 or the top semiconductor layer 130, and each successive gallium nitride layer 220, 230 is deposited only on the previously-deposited device layer.

With reference still to FIGS. 2A and 2B, seed layer 210, such as an AlN seed layer, is formed directly over a semiconductor layer such as supporting substrate 110. The thickness of seed layer 210 may range from 50 to 500 nm, though lesser and greater thicknesses may be used. In addition to or in lieu of AlN, the seed layer 210 may comprise, for example, GaN.

Formed directly over seed layer 210 is an optional buffer layer 220. An example buffer layer 220 comprises a Group III metal nitride. The buffer layer 220 may be deposited to a thickness of up to 1000 nm, e.g., 0, 100, 200, 500 or 1000 nm, including ranges between any of the foregoing values. The Group III metal nitride may be a compound including or more metal selected from Ga, Al and In, and may comprise, for example, GaN, AlN, AlGaN, InGaN, InAlN, InAlGaN or the like. The buffer layer 220 may contain intentional or unintended impurities. For example, the buffer layer may include one or more dopants including Si, Ge, Be, Mg, Zn, Cd or the like.

Formed directly over the buffer layer 220, if provided, or directly over the seed layer 210 is a gallium nitride layer 230. The gallium nitride layer 230 may be doped. For example, in embodiments the gallium nitride layer 230 comprises carbon-doped GaN. The thickness of the gallium nitride layer may range from 500 to 1500 nm, e.g., 500, 800, 1000, 1200, 1400 or 1500 nm, including ranges between any of the foregoing values.

In embodiments, both the composition and the thickness of the seed layer 210, the optional buffer layer 220, and the gallium nitride layer 230 may be selected independently. In embodiments, the layered structure comprising the gallium nitride layer 230, buffer layer 220 and seed layer 210 has a thickness of at least 1 micron.

The structures described herein may be disposed as a pattern that is periodic at least in one dimension, where the length and width (and the depth) of the recessed regions are constant over the substrate, and the succession of the stack architecture in one or more directions is periodic, which enables the formation of a transistor array of minimal area. The areal dimensions of the stacks with the recessed regions and their interspaces are thus continually repeated in one or more (e.g., orthogonal) directions of periodic succession. The length of one of these periods is called the pitch of the pattern.

Within the recessed regions, the layered structure 200 may have a length dimension of 1 to 200 microns (e.g., 1, 2, 5, 10, 50, 100 or 200 microns, including ranges between any of the foregoing values) and a width dimension of 1 to 200 microns (e.g., 1, 2, 5, 10, 50, 100 or 200 microns, including ranges between any of the foregoing values). Limiting the areal dimensions of the layered structure minimizes the propensity for cracking within the deposited layers.

In embodiments, the spacing between adjacent patterned regions may range from 50 to 200 microns, e.g., 50, 100, 150 or 200 microns, and may be less than, equal to, or greater than the length and width dimensions of the patterned region. The areal density of the patterned region may range from 25% to 50%.

Figure 3A:
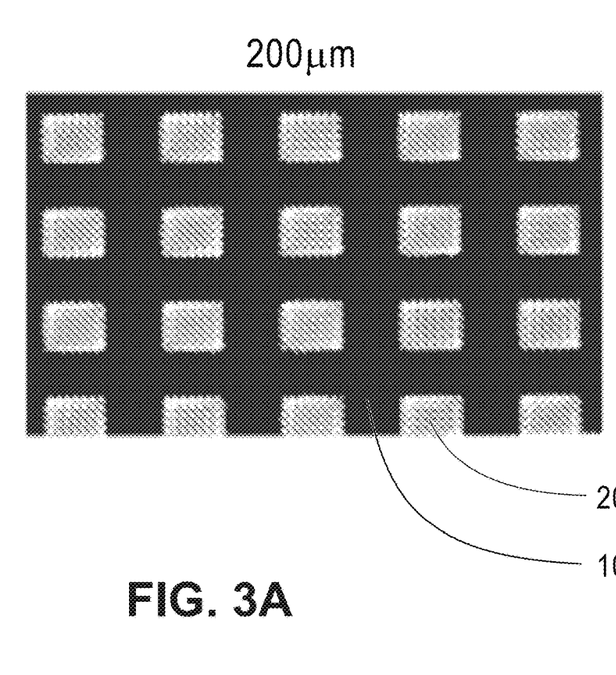
FIGS. 3A and 3B show top-down plan view optical micrographs of carbon-doped GaN structures grown on hybrid SOI substrates according to various embodiments.
Figure 3B:
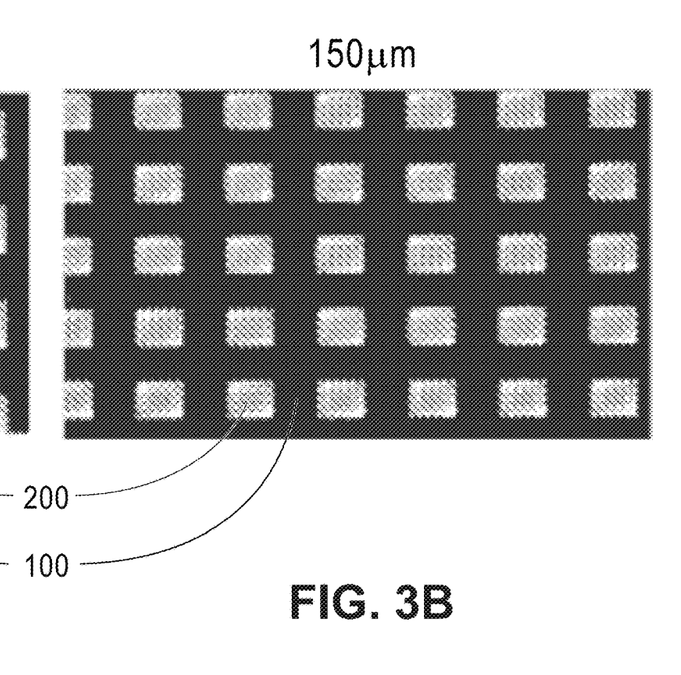
Figure 4:
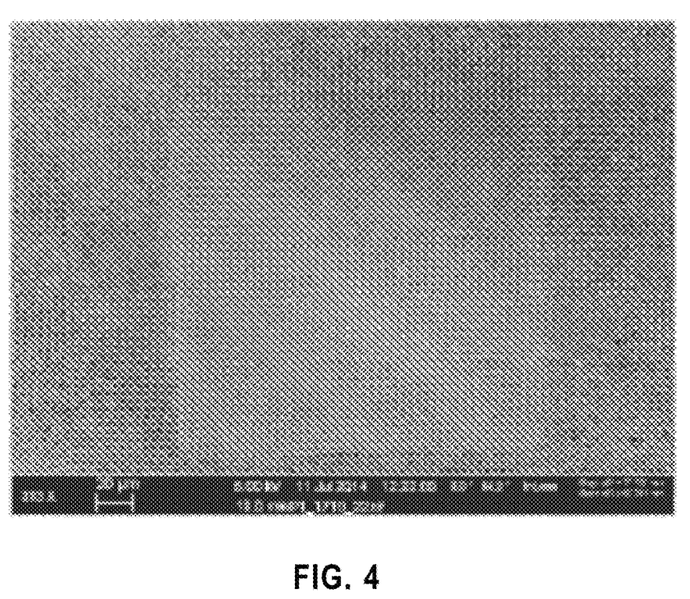
FIG. 4 is a top-down plan view SEM micrograph of the GaN structure of FIG. 3.

FIGS. 3A and 3B are top-down, plan view optical micrographs of carbon-doped GaN structures grown on hybrid SOI substrates. The structures in FIG. 3A have length and width dimensions of 200 microns. The structures in FIG. 3B have length and width dimensions of 150 microns. FIG. 4 is a top-down plan view scanning electron microscope (SEM) micrograph of the GaN structure of FIGS. 3A-3B.

Figure 5:
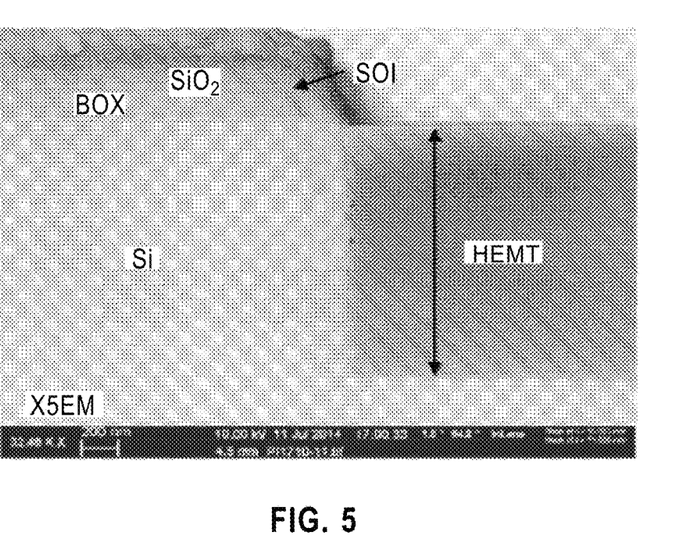
FIG. 5 is a cross-sectional SEM micrograph showing a HEMT structure including an aluminum nitride seed layer, aluminum gallium nitride buffer layer, and a carbon-doped GaN layer formed on a hybrid SOI substrate.
Figure 6:
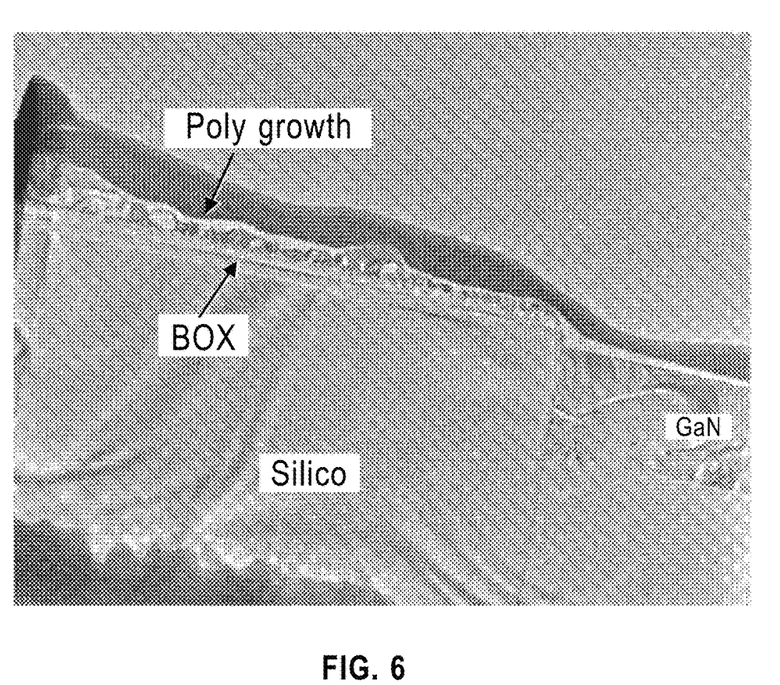
FIG. 6 is a cross-sectional TEM micrograph of the HEMT structure of FIG. 5.

FIG. 5 is a cross-sectional SEM micrograph showing a HEMT structure including an aluminum nitride seed layer, aluminum gallium nitride buffer layer, and a carbon-doped GaN layer formed within a recessed region that extends into the bottom supporting substrate 110 of a hybrid SOI substrate. FIG. 6 is a cross-sectional transmission electron microscopy (TEM) micrograph of the HEMT structure of FIG. 5.

Figure 7:
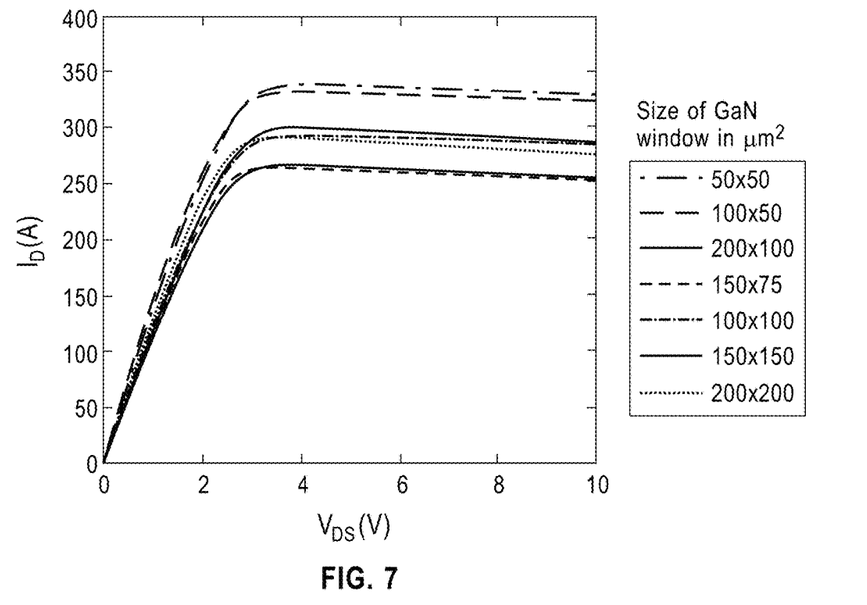
FIG. 7 is a plot of drain current versus source-drain voltage for patterned GaN HEMTs according to various embodiments.

FIG. 7 is a plot of drain current versus source-drain voltage for patterned GaN HEMTs having various areal dimensions.

Figure 8:
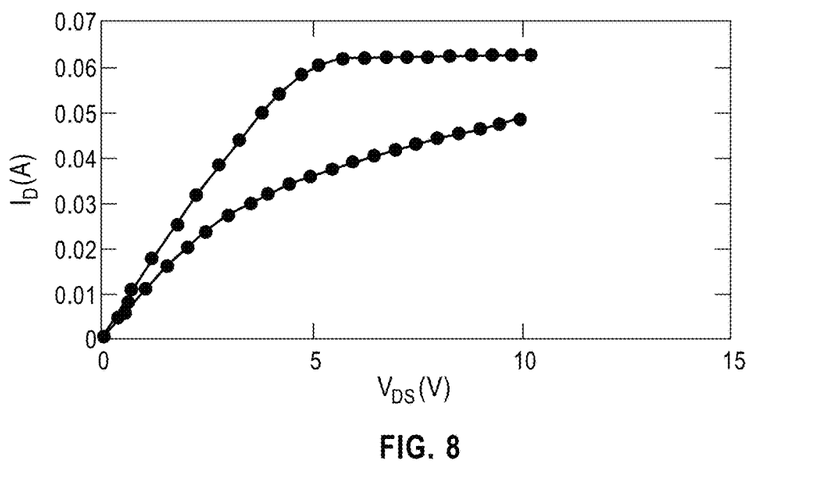
FIG. 8 is a plot of drain current versus source-drain voltage for a blanket carbon-doped GaN HEMT having a GaN layer thickness of 1 micron.

FIG. 8 is a plot of drain current versus source-drain voltage exemplifying current collapse for a blanket carbon-doped GaN HEMT having a GaN layer thickness of 1 micron. The upper trace is pulsed in a non-stressed manner. The quiescent point for the upper trace is Vg=0, Vds=0. The lower trace is pulsed in a stressed manner. The quiescent point for the lower trace is Vg=−3V, Vds=40V. For a given bias, the current is lower for the device pulsed to off-state conditions.

Figure 9:
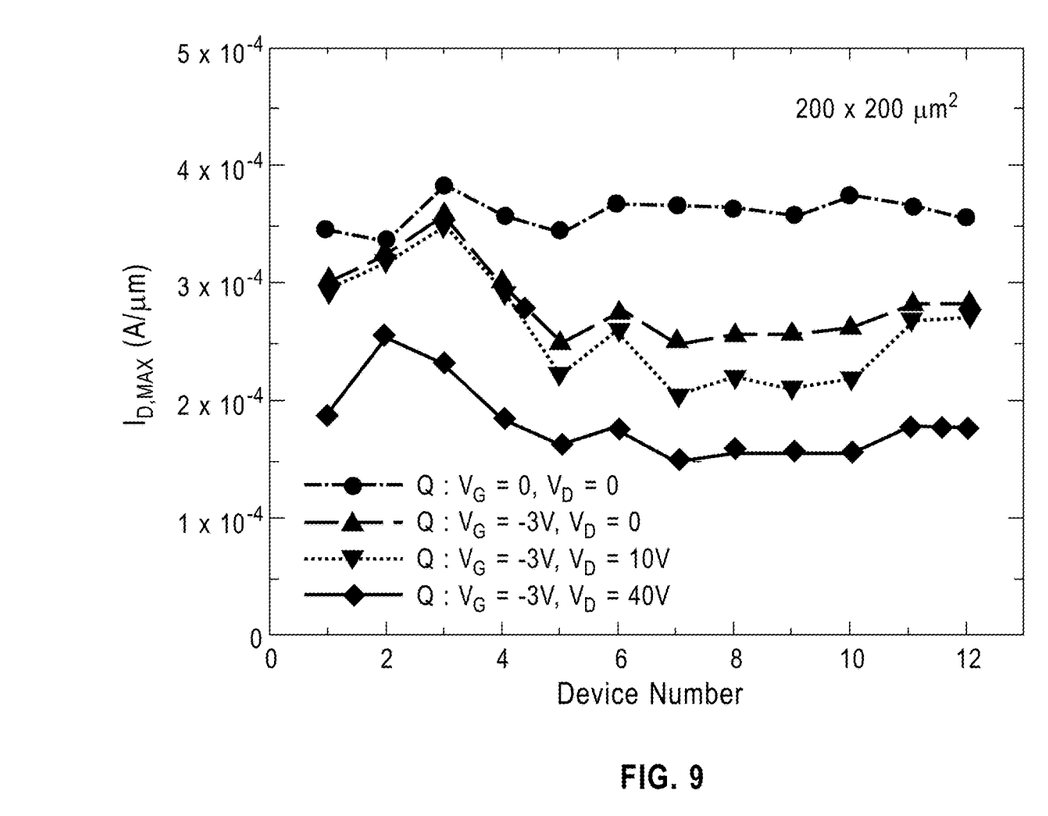
FIG. 9 is a graphic showing drain current for 200 micron× 200 micron carbon-doped GaN HEMTs having a GaN layer thickness of 1 micron.
Figure 10:
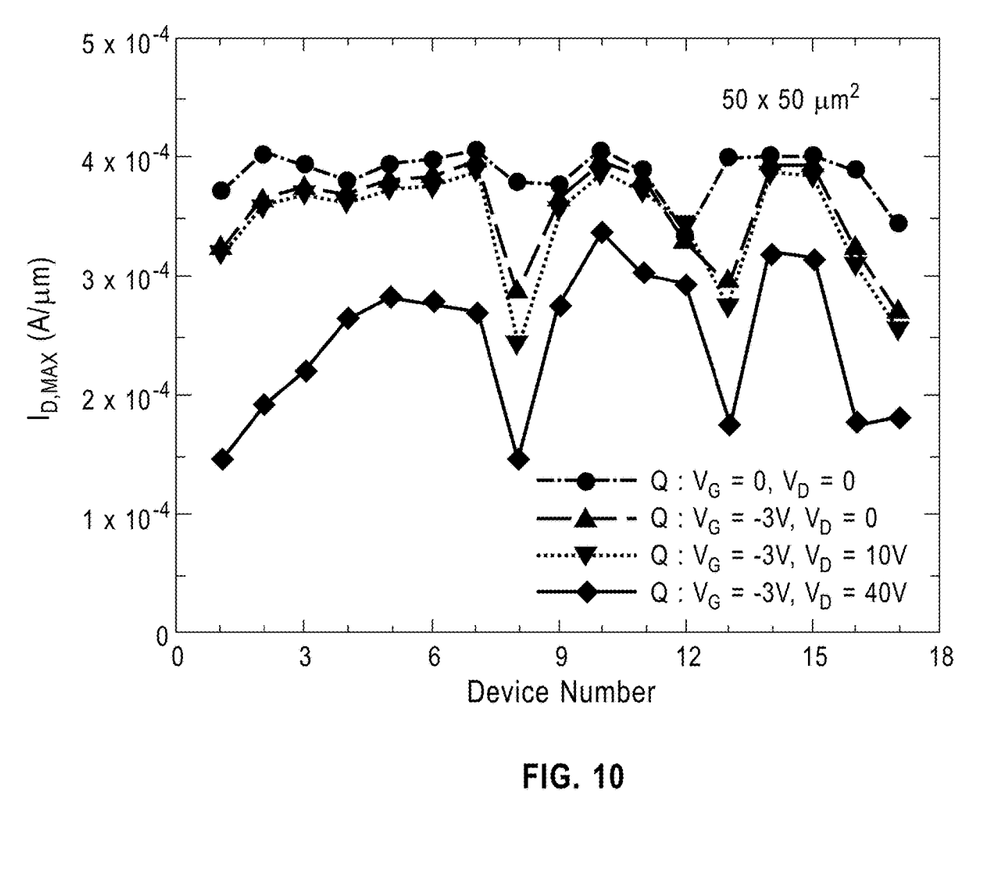
FIG. 10 is a graphic showing drain current for 50 micron× 50 micron carbon-doped GaN HEMTs having a GaN layer thickness of 1.2 to 1.4 micron.

FIGS. 9 and 10 are plots of maximum drain current under different stress states for different GaN HEMT devices formed from gallium nitride patterns measuring 200 micron×200 micron and having a GaN layer thickness of 1 micron (FIG. 9), and 50 micron>50 micron and having a GaN layer thickness of 1.2 to 1.4 micron (FIG. 10). Current collapse can be calculated as the difference in maximum current between a non-stressed pulsed condition (quiescent point: $V_g$=0, $V_{ds}$=0) and a stressed pulsed condition (quiescent point: $V_g$=−3V, $V_{ds}$=10V).

With reference first to FIG. 9, the calculated current collapse is greater than 20% for a majority of the 200 micron×200 micron samples. Turning to FIG. 10, current collapse is dramatically improved for the 50 micron×50 micron samples. For a majority of the samples evaluated, the current collapse is less than 20%. In embodiments, by engineering the dimensions of the gallium nitride layers, the measured current collapse can be less than 20%, e.g., less than 15% or less than 10%.

Figure 11:
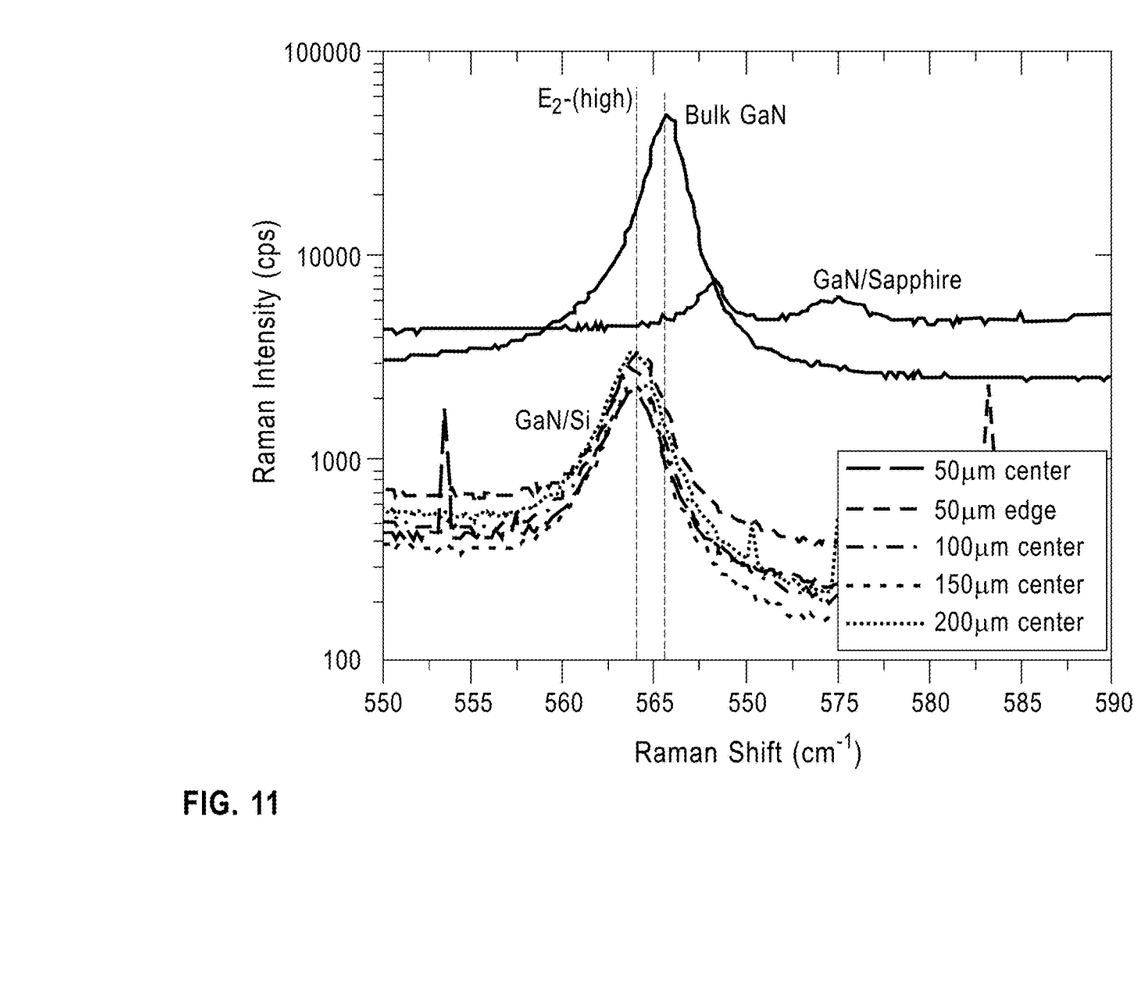
FIG. 11 is a series of micro Raman plots for patterned carbon-doped GaN structures showing no measureable variation in GaN-related peak position as a function of pattern size.

FIG. 11 is a series of micro Raman plots for patterned carbon-doped GaN structures showing no measureable variation in GaN-related peak position as a function of pattern size. The absence of a relative peak shift as among the GaN/Si samples (for different pattern sizes) is consistent with a conclusion that the observed changes in current collapse are not attributable to variations in the stress states of the GaN. Secondary ion mass spectrometry (SIMS) data from various patterned carbon-doped GaN windows (100 micron×100 micron; 150 micron×150 micron; and 200 micron×200 micron) show no measurable variation in the carbon doping as a function of pattern size.

Without wishing to be bound by theory, it is believed that the improved current collapse response is attributed to GaN stacks having maximum areal dimensions, even for a stack thickness greater than 1 micron, as compared with larger area, thinner stacks.

The GaN transistor structures disclosed herein may be incorporated into a broad range of equipment including power supplies, inverters in consumer appliances, and electric vehicles.

As used herein, the singular forms "a," "an" and "the" include plural referents unless the context clearly dictates otherwise. Thus, for example, reference to a "buffer layer" includes examples having two or more such "buffer layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a gallium nitride layer that comprises gallium nitride (GaN) include embodiments where a gallium nitride layer consists essentially of GaN and embodiments where a gallium nitride layer consists of GaN.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A semiconductor device comprising:
    a substrate having a recessed region disposed in a surface thereof, the recessed region includes a first vertical sidewall of the substrate, a second vertical sidewall of the substrate, and a horizontal surface of a semiconductor material of the substrate;
    a seed layer disposed within the recessed region and directly on the horizontal surface of the semiconductor material, wherein the seed layer extends continuously from the first vertical sidewall to the second vertical sidewall of the recess region; and
    a layered structure disposed on the seed layer, the layered structure comprising a buffer layer and a gallium nitride layer, wherein the buffer layer is present directly on a topmost surface of the seed layer and extends continuously from the first vertical sidewall to the second vertical sidewall, and wherein the seed layer and the layered structure have outermost vertical sidewalls that are vertically aligned to each other, wherein the first and second vertical sidewalls include a sidewall of a dielectric material and a sidewall of a topmost semiconductor layer, the sidewall of the dielectric material is between the sidewall of the topmost semiconductor layer and the horizontal surface of the semiconductor material of the substrate.

2. The device of claim 1, wherein the layered structure has a length of 10 to 50 microns and a width of 10 to 50 microns.

3. The device of claim 1, wherein the layered structure has a thickness of at least 1 micron.

4. The device of claim 1, wherein the layered structure has a thickness of 0.5 to 2.5 microns.

5. The device of claim 1, wherein the buffer layer comprises AlGaN and the gallium nitride layer comprises carbon doped GaN.

6. The device of claim 1, wherein the buffer layer has a thickness of 0 to 1000 nm and the gallium nitride layer has a thickness of 500 to 1500 nm.

7. The device of claim 1, wherein the substrate has a diameter of at least 50 mm and a thickness of 725 to 775 microns.

8. The device of claim 1, wherein the substrate is a semiconductor-on-insulator substrate.

9. The device of claim 1, wherein the first and second vertical sidewalls include a portion of the semiconductor material.

10. The device of claim 1, wherein the device has a current collapse of less than 10%.

11. The device of claim 1, wherein the device is a gallium nitride high electron mobility transistor.

12. The device of claim 1, wherein the recessed region has a depth of 0.6 to 3.5 microns.

13. The device of claim 1, wherein the substrate has a bow of less than 500 microns.

14. A semiconductor device comprising:
    a substrate having a recessed region disposed in a surface thereof, the recessed region includes a first vertical sidewall of the substrate, a second vertical sidewall of the substrate, and a horizontal surface of a semiconductor material of the substrate;
    a seed layer disposed within the recessed region and directly on the horizontal surface of the semiconductor material, wherein the seed layer extends continuously from the first vertical sidewall to the second vertical sidewall; and
    a structure comprising a gallium nitride layer located directly on a topmost surface of the seed layer, wherein gallium nitride layer extends continuously from, and is in direct contact with, the first vertical sidewall to the second vertical sidewall, and wherein the seed layer and the gallium nitride layer have outermost vertical sidewalls that are vertically aligned to each other, wherein the first and second vertical sidewalls include a sidewall of a dielectric material and a sidewall of a topmost semiconductor layer, the sidewall of the dielectric material is between the sidewall of the topmost semiconductor layer and the horizontal surface of the semiconductor material of the substrate.

15. The device of claim 14, wherein the structure has a thickness of at least 0.5 microns, a length of 1 to 200 microns, and a width of 1 to 200 microns.

16. The device of claim 1, wherein the layered structure has a thickness of at least 0.5 microns, a length of 1 to 200 microns, and a width of 1 to 200 microns.

* * * * *